(12) United States Patent
Terhune, IV

(10) Patent No.: US 7,785,125 B1
(45) Date of Patent: Aug. 31, 2010

(54) CONNECTOR HAVING STIFFENER WITH RETARING DEVICE LIMITING ROTATIONAL STROKE OF CLIP

(75) Inventor: Albert H. Terhune, IV, Chandler, AZ (US)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/386,456

(22) Filed: Apr. 16, 2009

(51) Int. Cl.
 *H01R 13/62* (2006.01)
(52) U.S. Cl. ........................... 439/331; 439/135
(58) Field of Classification Search ............... 439/331, 439/135, 73, 940
 See application file for complete search history.

(56) References Cited

U.S. PATENT DOCUMENTS

| | | | |
|---|---|---|---|
| 6,905,357 B2 * | 6/2005 | Ma | 439/331 |
| 7,147,483 B1 * | 12/2006 | Ju | 439/73 |
| 7,247,041 B2 | 7/2007 | Ma et al. | |
| 7,614,900 B1 * | 11/2009 | Polnyi | 439/342 |
| 2009/0197454 A1 * | 8/2009 | Liao | 439/331 |

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

A connector, comprises a housing (10) receiving a plurality of contacts, a stiffener (21) surrounding the housing and a cover (25) rotatably assembled to the stiffener and defining an open position and a closed position relative to the stiffener. The stiffener has a front wall (214) and a rear wall (215), and the front wall is formed with at least one retarding piece (217). The cover has at least one tab (254) engaging with the stiffener when the cover is at the open position, the tab is disposed above the retarding piece, thereby the retarding piece limits a downwardly movement of the cover.

19 Claims, 4 Drawing Sheets

CONNECTOR HAVING STIFFENER WITH RETARING DEVICE LIMITING ROTATIONAL STROKE OF CLIP

FIELD OF THE INVENTION

The present invention relates to a socket assembly, and more particularly to a socket assembly with a stiffener having a retarding device for limiting a rotational stroke of a clip pivotally assembled to the stiffener.

DESCRIPTION OF RELATED ART

An land grid array connector, adapted for electrically connecting an integrated Circuit (IC) package to a Printed Circuit Board (PCB), is typically described in U.S. Pat. No. 7,247,041, which was issued to Ma et al on Jul. 4, 2007. The connector comprises a stiffener having a front wall and a rear wall, a housing received within the stiffener for supporting the IC package, a plurality of contacts retained within the housing, a cover and a lever respectively rotatably mounted on the rear wall and the front wall of the stiffener, respectively. The stiffener has a plurality of circular mounting holes defined at four corner portions thereof. A plurality of screws insert throughout into the circular mounting holes and then engaged with the PCB for securing the connector onto the PCB.

The cover is pivotally assembled to the stiffener by two spaced arch craws rotationally engaging with two through holes on the rear wall of the stiffener, the cover further has a tab disposed between the arch craws and abutting against a top surface of the rear wall of the stiffener for preventing the cover from over-rotating. However, the tab may easily scratch the PCB on which the connector is mounted and destroys circuit traces on the PCB in case the tab incidentally scratches across the PCB.

Hence, an improved land grid array connector is required to overcome the above-mentioned disadvantages of the related art.

SUMMARY OF THE INVENTION

An object of the present invention is to provide an improved stiffener in which a retarding device is provided so as to prevent a cover of the stiffener from scratching conductive traces of a PCB.

To achieve the aforementioned objects, a socket assembly, comprises a housing receiving a plurality of contacts, a stiffener surrounding the housing and a cover rotatably assembled to the stiffener and defining an open position and a closed position relative to the stiffener. The stiffener has a front wall and a rear wall, and the front wall is formed with at least one retarding piece. The cover has at least one tab engaging with the stiffener when the cover is located at the open position, the tab is disposed above the retarding piece, thereby the retarding piece limits a downwardly movement of the cover.

Other objects, advantages and novel features of the invention will become more apparent from the following detailed description of a preferred embodiment when taken in conjunction with the accompanying drawings.

DETAILED DESCRIPTION OF THE INVENTION

Figure 1:
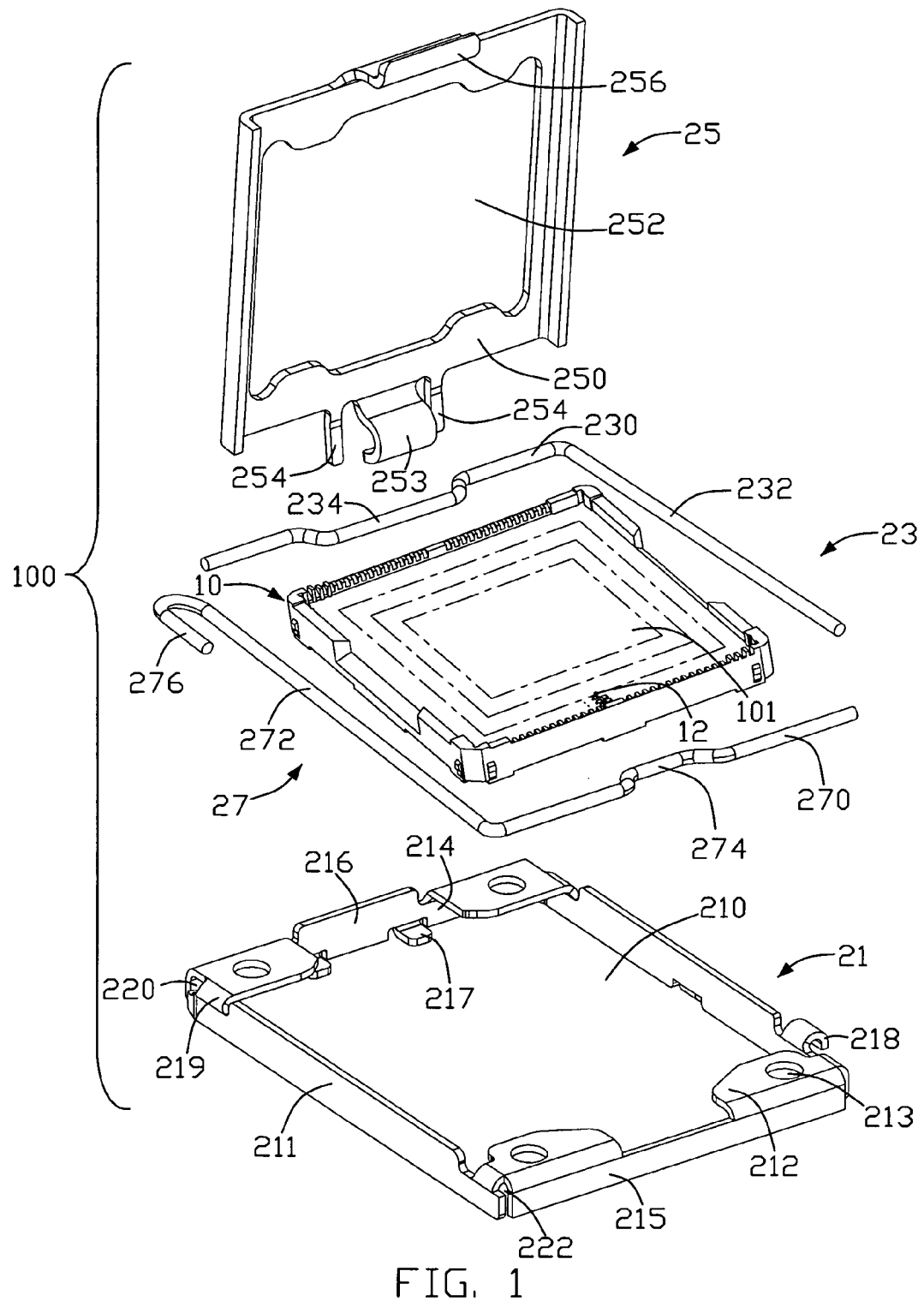
FIG. 1 is an exploded, perspective view of a connector in accordance with the present invention.

Reference will now be made to the drawing figures to describe the present invention in detail.

Figure 2:
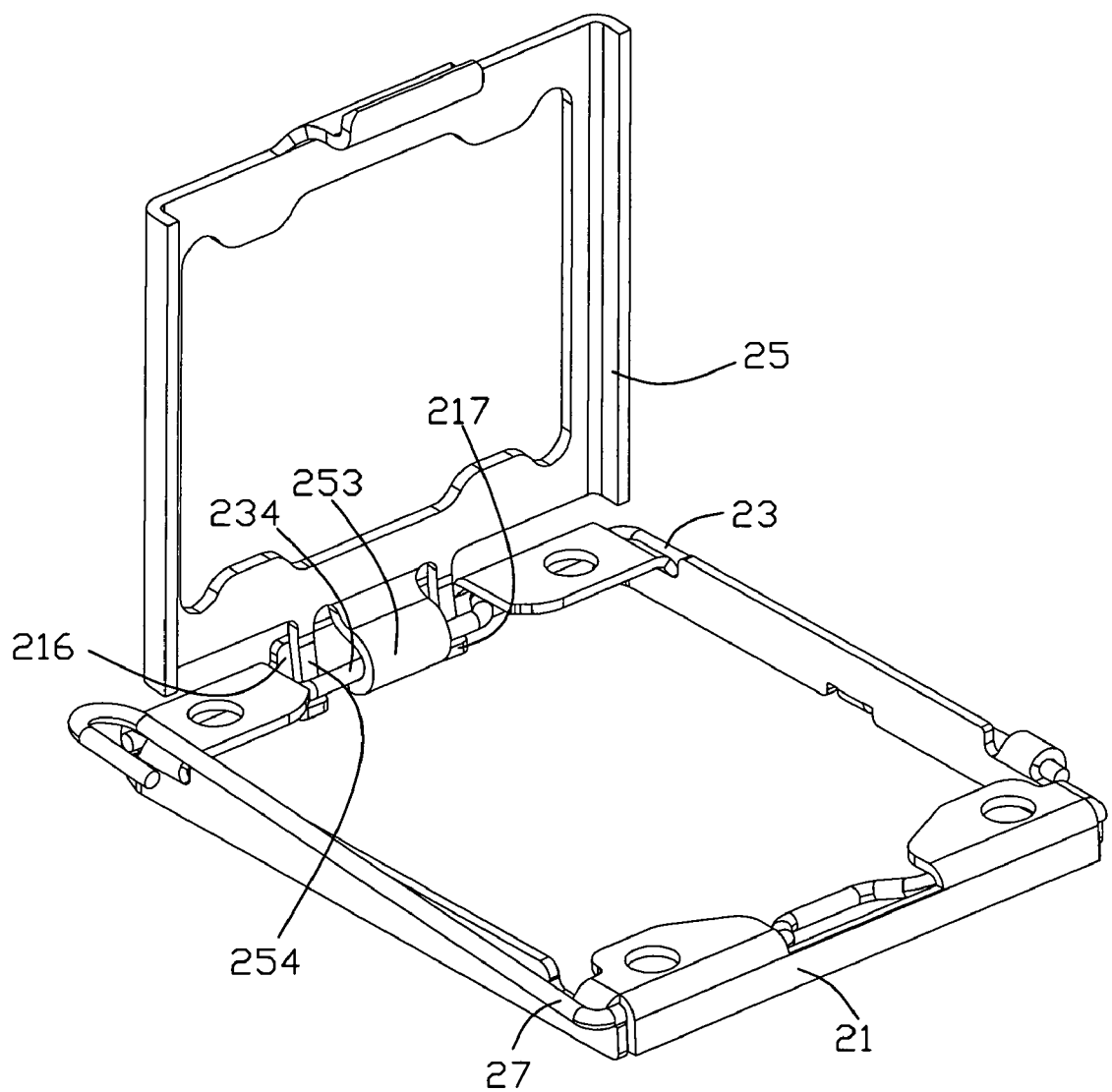
FIG. 2 is an assembled, perspective view of a loading mechanism of the connector as shown in FIG. 1, wherein a cover of the loading mechanism is in an open position.

Referring to FIGS. 1-2, a land grid array (LGA) socket 100 made in accordance with the preferred embodiment of the present invention is adapted for electrically connecting an IC package (not shown) and a PCB (not shown). The socket 100 comprises a housing 10, a plurality of contacts 12 inserted within the housing 10 for electrically connecting the IC package (not shown) and the PCB (not shown), and a loading mechanism 20 for retaining the IC package (not shown) toward the housing 10.

Referring to FIG. 1, the housing 10 has a rectangular configuration, which comprises a conductive region 101 in a center thereof and a plurality of slots (not labeled) defined in the conductive region 101 for receiving the contacts 12 therein. The loading mechanism 20 comprises a metallic stiffener 21 with an opening 210 in a central thereof for surrounding the housing 10, a pivotal shaft 23 assembled to a front end of the stiffener 21, a metallic cover 25 assembled on the front end of the stiffener 21 by pivotally linking to the pivotal shaft 23, and a lever 27 rotatably assembled on a rear end of the stiffener 21.

The stiffener 21 is a rectangular frame with four sidewalls surrounding the opening 210 and four mounting portions 212 disposed on four corners thereof. Each mounting portion 212 defines a mounting hole 213 for having a screw (not shown) passed therethrough to secure the stiffener 21 to the PCB (not shown). All the sidewalls stand in a vertical direction, and each mounting portion 212 links with top edges of two adjacent sidewalls.

The sidewalls of the stiffener 21 include a front wall 214, a rear wall 215 and two lateral sidewalls 211 linking the front wall 214 and the rear wall 215. A middle part 216 of the front wall 214 disposed between two adjacent mounting portions 212 further extends upwardly beyond a top surface of the mounting portion 212, while an opposite middle part of the rear wall 215 disposed between another two mounting portions 212 is lower than the top surface of the mounting portion 212. The middle part 216 of the front wall 214 has two retarding pieces 217 bent inwardly toward the opening 210 from a bottom edge thereof and extending along a substantially horizontal plane. The stiffener 21 further defines a first slot 220 along the front wall 214 surrounded by the lateral sidewalls 211, the front wall 214 and the mounting portions 212 on a front end thereof and a second slot 222 surrounded by the lateral sidewalls 211, the rear wall 215 and the mounting portions 212 on a rear end thereof.

The pivotal shaft or bar 23 has a substantially L-shaped configuration, and comprises a transverse part 230 inserted and retained within the first slot 220 and a longitudinal part 232 being perpendicular to the transverse part 230 and set beside the lateral sidewall 211. The longitudinal part 232 is supported by a finger 221 extending from a bottom edge of the lateral sidewall 211 and is positioned by a latching claw 218 extending from a top edge of the lateral sidewall 211. The transverse part 230 and is formed with a U-shaped engaging part or a crank section 234 inwardly bent toward the opening 210 of the stiffener 21 to have a distance with an axes of the rest part thereof.

The cover 25 has a substantially rectangle shape, which has a main plane 250 with a window 252 in a center thereof and two side edges extending downwardly from the main plane 250. The cover 25 is formed with a latching arm 253 and two tabs 254 on two sides of the latching arm 253, each of latching arm 253 and tabs 254 forwardly extending from a front edge of the main plane 250 thereof. The tabs 254 are located substantially in a same plane with the main plane 250, while the latching arm 253 is located below the main plane 250. The cover 25 further has a pressed portion 256 rearward and downwardly extending from a middle part of a rear edge of the main plane 250 thereof. In brief, the cover 25 essentially defines two opposite lengthwise ends with one longitudinal end pivotally mounted around one end of the stiffener, and defining a rotation section around the latching arm 253 at that longitudinal end and a pressing section 256 at the other longitudinal end.

The cover 25 is rotationally assembled to the front end of the stiffener 21 by the latching arm 253 engaged with the engaging part 234 of the pivotal shaft 23 assembled on the stiffener 21. The latching arm 253 is disposed on an inner side of the engaging part 234, while the tabs 254 are disposed on an outer side of the engaging part 234. In fact, the tab 254 is located between the middle part 216 of the front wall 214 and the engaging part 234 and above the retarding piece 217.

The lever or bar 27 comprises a shaft 270 and an actuator 272 perpendicular to the shaft 270 thereby forming the lever 27 as an L-shaped configuration. The shaft 270 has a U-shaped bending portion or a crank section 274 bent inwardly from a middle portion thereof. The actuator 272 is provided with a handle 276 at a free end thereof. The shaft 270 of the lever 27 is received in the second slot 222 of the stiffener 21 to pivotally assemble the lever 27 on the rear end of the stiffener 21, the actuator 272 is set beside the other lateral sidewall 211 and locked by a projection 219, which protrudes outwardly from an end of the other lateral sidewall 211 near the front wall 214. Thus, the loading mechanism 21 completes its assembly.

Referring to FIG. 1, the housing 10 together with the preloaded contacts 12 is mounted within the opening 210 of the loading mechanism 20 which is mounted on the PCB, and soldered to the PCB.

Figure 3:
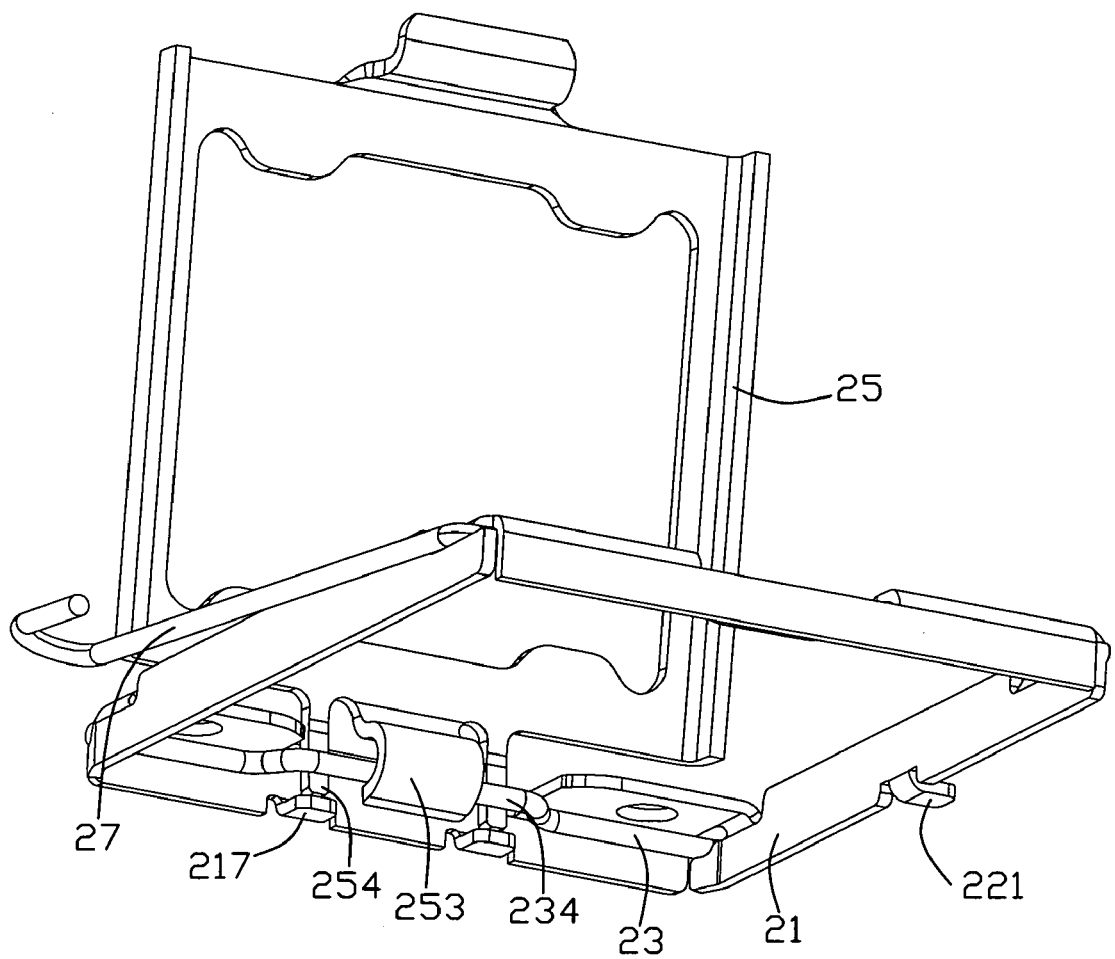
FIG. 3 is similar with FIG. 2, but taken from a bottom side.
Figure 4:
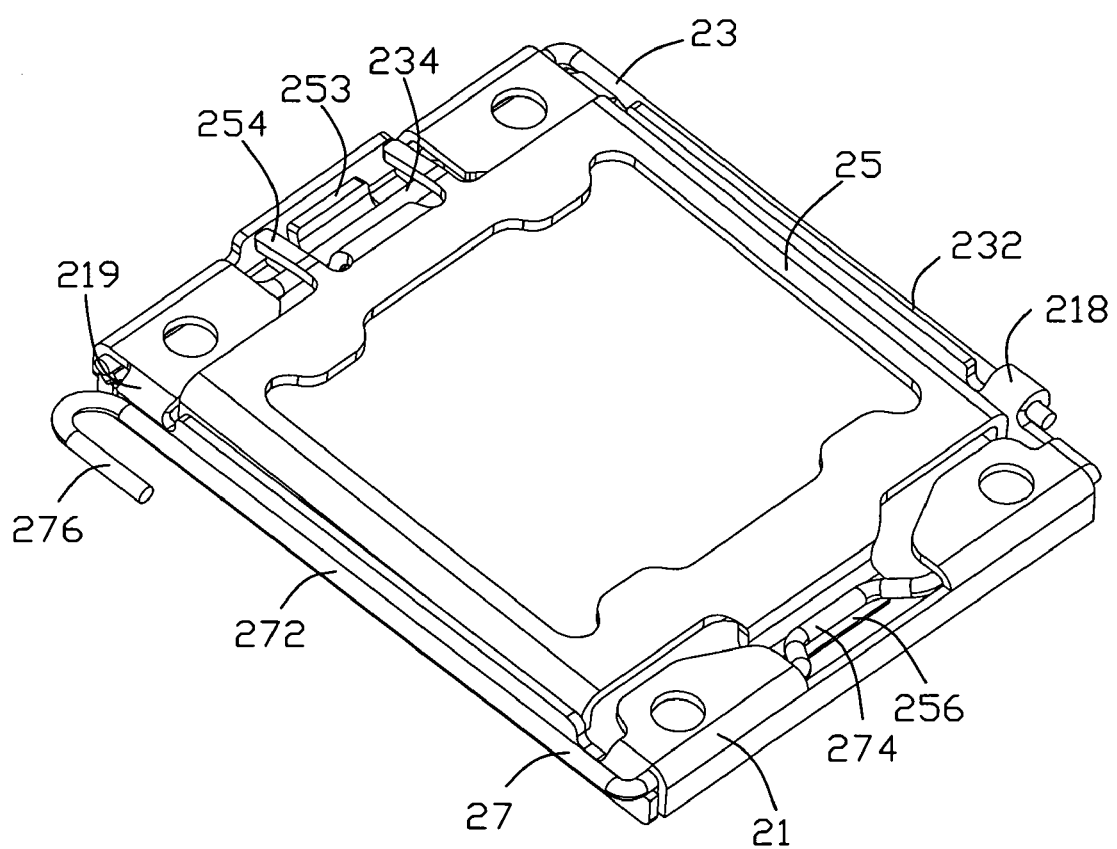
FIG. 4 is another assembled perspective view of the loading mechanism, wherein the cover and a level of the loading mechanism is in a closed position.

Referring to FIGS. 2-4, in operation, the actuator 272 of the lever 27 is rotated upwardly to an open position (not shown) due to an external force exerted on the handle 276, then the cover 25 is rotated to an open position. The IC package (not shown) is disposed on the housing 10 and electrically connects the PCB (not shown) via the contacts 12. The cover 25 downwardly rotates to cover the housing 10 at a closed position, with the side edges 252 thereof located between the two lateral sidewalls 211 of the stiffener 21. Then, the actuator 272 is driven to a closed position by the handle 276, and the bending portion 274 depresses downwardly against the pressed portion 256 of the cover 25, so that the IC package (not shown) is pressed by the cover 25 to reliably contact with the contacts 12 within the housing 10. The actuator 272 engages with the projection portion 219 to keep the level 27 together with the cover 25 in the closed position.

When the cover 25 is at the open position, the tab 254 abut against a top surface of the middle part 216 of the stiffener 21 and the bottom face of the pivotal shaft 23, respectively, so as to prevent the cover 25 from over rotating. The retarding pieces 217 of the stiffener 21 below the tabs 254 may abut against the tabs 254 during a rotation of the cover 25 relative to the stiffener 21, and limit the tabs 254 of the cover 25 to move downwardly to prevent the tabs 254 from scratching the PCB (not shown) during rotation of the cover 25, so that the tabs 254 will not scratches the PCB (not shown).

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A connector comprising:
   a housing receiving a plurality of contacts;
   a stiffener surrounding the housing and having a front wall and a rear wall, the front wall formed with at least one retarding piece extending in a substantially horizontal plane; and
   a cover rotatably assembled to the stiffener and defining an open position and a closed position relative to the stiffener, the cover having at least one tab engaged with the stiffener when the cover is at the open position, the retarding piece locating under the tab to limit the cover to move downwardly.

2. The connector as claimed in claim 1, wherein the retarding piece is bent from a bottom edge of the front wall.

3. The connector as claimed in claim 1, further comprising a pivotal shaft assembled to a front end of the stiffener by which the cover is rotatably assembled to the stiffener.

4. The connector as claimed in claim 3, wherein the stiffener has two lateral sidewall connecting the front wall and the rear wall, and defines a first slot at the front end thereof, the pivotal shaft has a substantially L-shaped configure, which comprises a transverse part inserted into and retained into the first slot and a longitudinal part being perpendicular to the transverse part and set beside the lateral sidewall.

5. The connector as claimed in claim 4, wherein the longitudinal part is supported by a slice extending from a bottom edge of the lateral sidewall and is locked by a latching claw extending from a top edge of the lateral sidewall.

6. The connector as claimed in claim 4, wherein the transverse part is formed with a U-shaped engaging part inwardly bent to have a distance with an axe of the rest part thereof.

7. The connector as claimed in claim 6, wherein the cover has a latching arm extending forwardly, and the at least one tab is two tabs disposed beside two side of the latching arm, the latching arm latches with the engaging part of the pivotal shaft to pivotally link the cover to the pivotal shaft.

8. The connector as claimed in claim 7, wherein the latching arm is disposed on an inner side of the engaging part, while the tabs are disposed on an external side of the engaging part, exactly, the tab is located between the front wall of the stiffener and the engaging part of the pivotal shaft and above the retarding piece.

9. The connector as claimed in claim 7, further comprising a lever pivotally assembled to a rear end of the stiffener to retain the cover on the stiffener, the level comprises a shaft and an actuator perpendicular to the shaft, the shaft has a U-shaped bending portion, the actuator is provided with a handle at a free end thereof.

10. The connector as claimed in claim 7, wherein the stiffener has a rectangle frame shape with an opening surrounding the housing and four mounting portions disposed on four corners thereof, each mounting portion defines a mounting hole for a screw passing throughout to mount the stiffener to a printed circuit board (PCB).

11. A loading mechanism mounted on a printed circuit board, comprising:

a stiffener mounted to the printed circuit board with at least one retarding piece bent from a bottom edge thereof and extending substantially in a horizontal plane;

a pivotal shaft assembled to an end of the stiffener, and a cover having a latching arm which links with the pivotal shaft to rotatably assemble said end of the cover to the stiffener, the cover having at least one tab extending from an edge of the cover and beside the latching arm, the tab being disposed above the retarding piece and abutting against the retarding piece during a rotation of the cover relative to the stiffener.

12. The mechanism as claimed in claim 11, wherein the stiffener has a rectangle frame shape with four sidewalls surrounding an opening and four mounting portions disposed on four corners thereof.

13. The mechanism as claimed in claim 12, wherein each mounting portion defines a mounting hole for a screw passing throughout to mount the stiffener to the PCB, all the sidewalls stand in a vertical direction, and each mounting portion links with top edges of two adjacent sidewalls.

14. The mechanism as claimed in claim 13, wherein the sidewalls of the stiffener include a front wall, a rear wall and two lateral sidewalls linking the front wall and the rear wall, the retarding piece extends from a middle part of the front wall disposed between two adjacent mounting portions.

15. The mechanism as claimed in claim 11, further comprising a lever pivotally assembled to a rear end of the stiffener to retain the cover on the stiffener.

16. An electrical connector comprising:

an insulative housing defining an upward receiving cavity in a top face thereof;

a plurality of contacts disposed in the housing with contacting sections upwardly extending into the receiving cavity;

a metallic stiffener surrounding the housing in a rectangular configuration having two opposite lengthwise sides and two opposite lateral sides;

a metallic cover defining two opposite longitudinal ends with one longitudinal end pivotally mounted around one end of the stiffer, and defining a rotation section at said one longitudinal end and a pressing section at the other longitudinal end;

a first L-shaped bar extending beside and long one of said lengthwise sides and one of said lateral sides, and defining a crank section to press against the pressing section of the metallic cover; and a second L-shaped bar extending beside and along the other of said lengthwise sides and the other of said lateral sides, and defining a second crank section to abut against the rotation section; wherein the stiffener includes a plurality of side walls, a plurality of mounting portions are formed on upper edges of said side walls, and each of said mounting portions defines a mounting hole for having a screw extending therethrough.

17. The electrical connector as claimed in claim 16, wherein said cover defines tab abutting against the second L-shaped bar for preventing further rotation of the cover when the cover is moved to an upright position.

18. The electrical connector as claimed in claim 16, wherein the first bar is moveable for rotation of the cover while the second bar not.

19. The electrical connector as claimed in claim 16, wherein the stiffener defines a retarding piece formed on a bottom edge of one of said side walls, the cover defines one tab extending from one edge of the cover, and the tab abuts against the retarding piece during rotation of said cover relative to the stiffener.

* * * * *